(12) United States Patent
Horie et al.

(10) Patent No.: US 10,490,419 B2
(45) Date of Patent: Nov. 26, 2019

(54) METHOD OF MANUFACTURING SEMICONDUCTOR DEVICE

(71) Applicant: Renesas Electronics Corporation, Tokyo (JP)

(72) Inventors: Kazuya Horie, Hitachinaka (JP); Katsuhiro Uchimura, Hitachinaka (JP); Kazuhiro Toi, Hitachinaka (JP); Masakazu Nakano, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 372 days.

(21) Appl. No.: 15/643,341

(22) Filed: Jul. 6, 2017

(65) Prior Publication Data

US 2018/0068856 A1 Mar. 8, 2018

(30) Foreign Application Priority Data

Sep. 6, 2016 (JP) ................................. 2016-173549

(51) Int. Cl.
*H01L 21/324* (2006.01)
*H01L 21/3065* (2006.01)
(Continued)

(52) U.S. Cl.
CPC ...... *H01L 21/324* (2013.01); *H01L 21/28035* (2013.01); *H01L 21/3065* (2013.01); *H01L 21/31116* (2013.01); *H01L 21/32135* (2013.01); *H01L 21/32155* (2013.01); *H01L 29/66734* (2013.01); *H01L 21/28114* (2013.01); *H01L 21/31055* (2013.01); *H01L 29/66* (2013.01); *H01L 29/66659* (2013.01); *H01L 29/66727* (2013.01)

(58) Field of Classification Search
None
See application file for complete search history.

(56) References Cited

U.S. PATENT DOCUMENTS 8,633,510 B2   1/2014   Matsuura et al.
9,041,050 B2   5/2015   Matsuura
(Continued)

FOREIGN PATENT DOCUMENTS

JP   2012-256839 A   12/2012
JP   2013-140885 A   7/2013

*Primary Examiner* — Bradley Smith
(74) *Attorney, Agent, or Firm* — McGinn IP Law Group, PLLC

(57) ABSTRACT

In manufacturing a trench type MOSFET, reliability of a semiconductor device is prevented from being degraded due to a short circuit or lowering of withstand voltage between a trench gate electrode and a source region. To achieve the above, poly-silicon films are formed inside a trench in a main surface of a semiconductor substrate and over the semiconductor substrate. Further, phosphorus is thermally diffused into each poly-silicon film from a phosphorous film over an upper surface of the poly-silicon film. Still further, a silicon oxide film formed in a surface layer of the poly-silicon film by the thermal diffusion process is removed by a first dry etching process using a fluorocarbon gas or a hydroxy-fluorocarbon gas. Then, by performing a second dry etching process using a Cl2 gas etc., an insulating film is exposed and, thereby, a trench gate electrode including the poly-silicon film is formed.

20 Claims, 8 Drawing Sheets

(51) Int. Cl.
*H01L 21/311* (2006.01)
*H01L 21/28* (2006.01)
*H01L 21/3215* (2006.01)
*H01L 21/3213* (2006.01)
*H01L 29/66* (2006.01)
H01L 21/3105 (2006.01)

(56) References Cited

U.S. PATENT DOCUMENTS

2006/0054970 A1* 3/2006 Yanagida ............ H01L 29/1095
257/330
2011/0159651 A1* 6/2011 Matsui .............. H01L 29/66734
438/270
2012/0098056 A1* 4/2012 Blanchard ......... H01L 29/66727
257/330
2016/0133742 A1* 5/2016 Okuda ................ H01L 29/7813
257/330

* cited by examiner

METHOD OF MANUFACTURING SEMICONDUCTOR DEVICE

CROSS-REFERENCE TO RELATED APPLICATIONS

The disclosure of Japanese Patent Application No. 2016-173549 filed on Sep. 6, 2016 including the specification, drawings and abstract is incorporated herein by reference in its entirety.

BACKGROUND

The present invention relates to a method of manufacturing a semiconductor device and is, for example, suitably applicable to a method of manufacturing a semiconductor device including a trench type MOSFET.

As one of the MOSFETs (Metal Oxide Semiconductor Field Effect Transistor, MOS type field-effect transistor), there is commonly used a trench type MOSFET including a gate electrode which is embedded inside a trench, via a gate insulating film, formed in a main surface of the semiconductor substrate. Also, when forming a trench gate electrode with high-concentration impurities, there is known a method as follows. That is, first, a silicon film for filling the trench is formed. Then, by applying heat treatment in a state where a film containing impurities is deposited over the silicon film, the impurities are diffused from the film into the silicon film to form the trench gate electrode including the silicon film.

In Patent Document 1 (Japanese Unexamined Patent Application Publication No. 2012-256839), there is disclosed an example in which a silicon oxide film and a poly-silicon film are simultaneously etched using a mixed gas of $CH_4$ and $CHF_3$.

Moreover, in Patent Document 2 (Japanese Unexamined Patent Application Publication No. 2013-140885), there is disclosed an example in which a silicon film is etched using a $CH_4$ gas and an $O_2$ gas.

SUMMARY

As described above, after the formation of the film containing impurities over the silicon film, when the impurities are diffused into the silicon film by heat treatment, an oxide film may be formed in a surface layer of the silicon film. In such a case, even if wet etching is performed after removal of the film including impurities, the oxide film formed in the surface layer of the silicon film may remain without being removed. The silicon film is etched back with such an oxide film being left and when trying to form a trench gate electrode, leaving the silicon film inside the trench alone in the upper surface of the semiconductor substrate, the etch-back is disturbed by the oxide film and the silicon film remains over a semiconductor region, causing a short circuit etc.

Other objects and novel features will become apparent from the description herein and accompanying drawings.

Of the preferred embodiments disclosed in the present application, representative ones will be next outlined briefly.

The method of manufacturing the semiconductor device being one embodiment includes the steps of: thermally diffusing phosphorus into a silicon film formed inside a trench in a main surface of the semiconductor substrate and over a semiconductor region from a film over the silicon film; and after removing the film, applying dry etching with use of a fluorocarbon gas or a hydroxy-fluorocarbon gas, thereby allowing an upper surface of the silicon film to retreat.

According to one embodiment, reliability of the semiconductor device can be improved.

DETAILED DESCRIPTION

Figure 1:
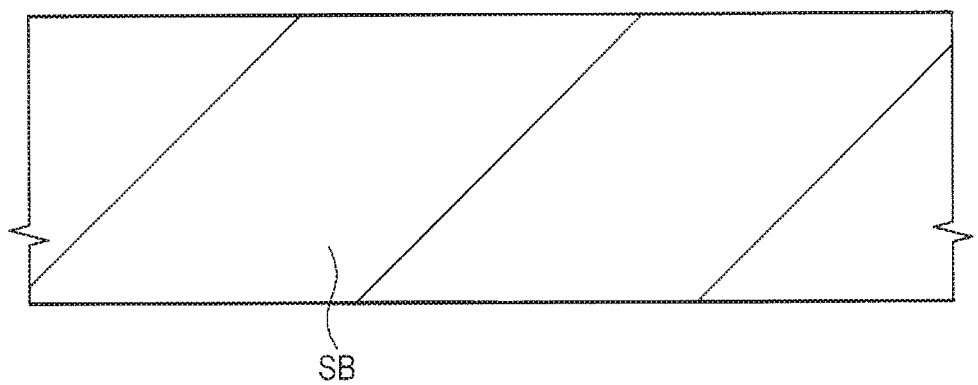
FIG. 1 is a cross-sectional view showing a manufacturing process of a semiconductor device being an embodiment of the present invention.

Now, the preferred embodiments of the present invention will be explained below in detail with reference to the accompanying drawings. Throughout the drawings for explaining the embodiment, the same reference characters designate the same or functionary equivalent components, and their explanations will not be repeated where redundant. In the description that follows, the explanations will not be repeated in principle unless specifically needed.

Figure 2:
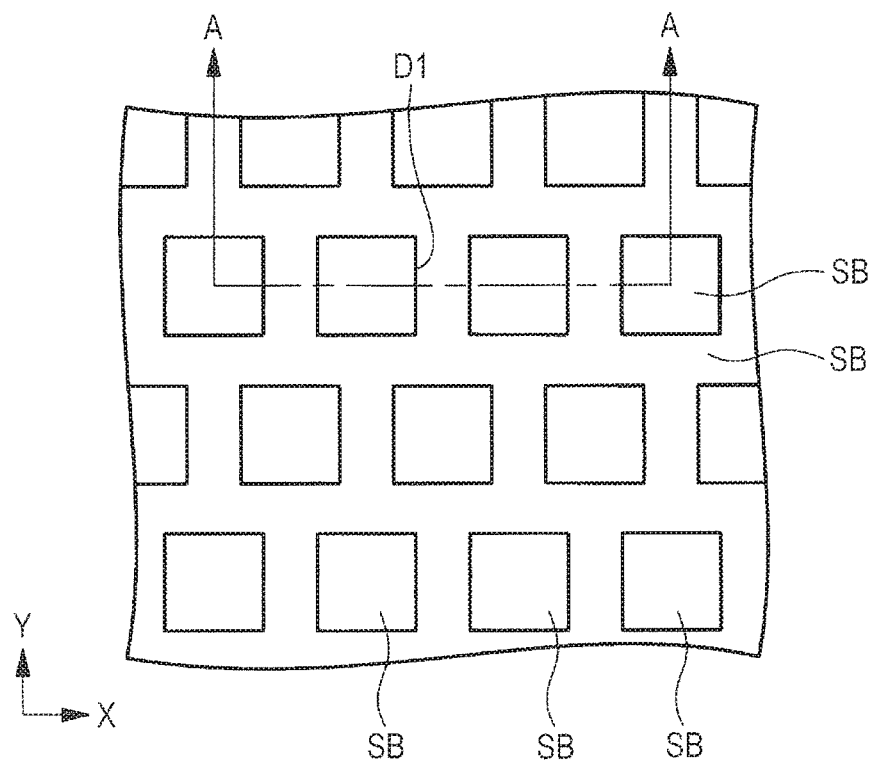
FIG. 2 is a plan view showing the manufacturing process of the semiconductor device being the embodiment of the present invention.
Figure 3:
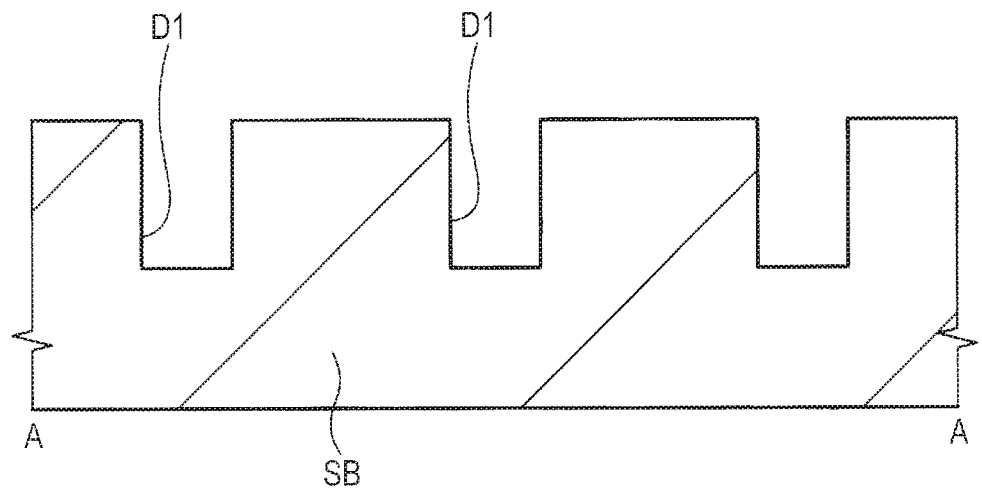
FIG. 3 is a cross-sectional view taken along line A-A of FIG. 2.
Figure 12:
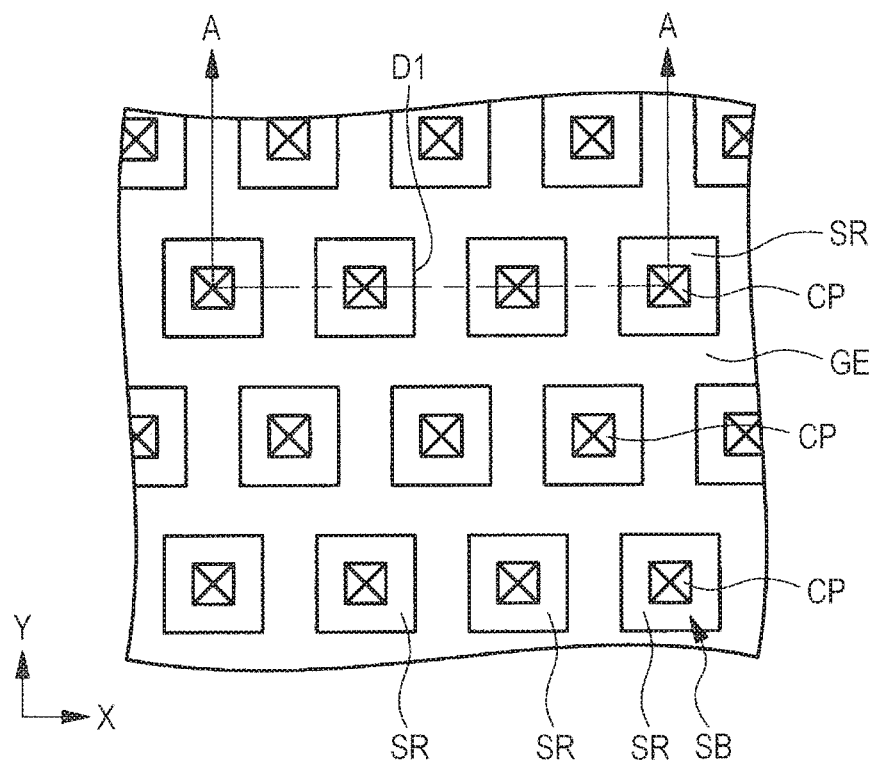
FIG. 12 is a plan view showing a manufacturing process of the semiconductor device subsequent to the manufacturing process shown in FIG. 11.
Figure 13:
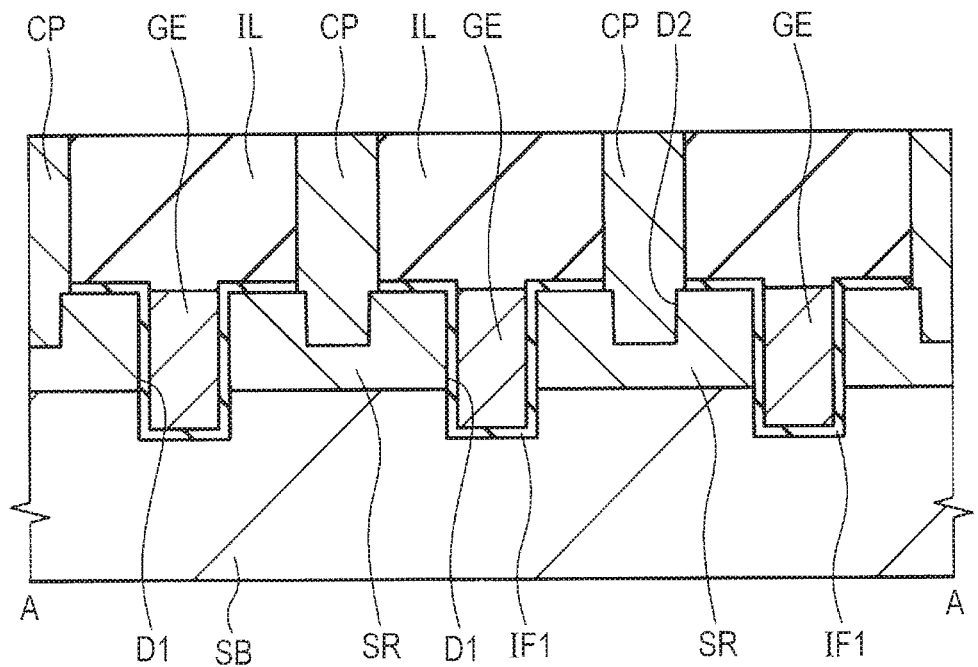
FIG. 13 is a cross-sectional view taken along line A-A of FIG. 12.

<Method of Manufacturing Semiconductor Device> Hereafter, with reference to FIGS. 1 to 14, a method of manufacturing a semiconductor device according to the present embodiment will be explained. FIGS. 1, 3 to 11, and 13 to 14 are cross-sectional views showing the manufacturing processes of the semiconductor device according to the present embodiment. FIGS. 2 and 12 are plan views showing the manufacturing processes of the semiconductor device according to the present embodiment. FIGS. 3 and 13 are cross-sectional views taken along lines A-A of FIGS. 2 and 12, respectively.

The present application relates to a semiconductor device provided with a trench type MOSFET including a gate electrode embedded inside a trench formed in a main surface of the semiconductor substrate, i.e., a trench gate electrode. According to the invention of the present application, as will be explained below, in the trench type MOSFET, when forming the trench gate electrode, the process will be performed as follows. That is, phosphorus is thermally diffused in Si (silicon) films formed inside and outside of the trench in the main surface of the semiconductor substrate. Then, an oxide film in a surface layer of each silicon film is removed by dry etching. Thus, it becomes possible to prevent the occurrence of a short circuit or lowering of withstand voltage due to an etching failure of the silicon film.

First, as shown in FIG. 1, a semiconductor substrate SB is provided. The semiconductor substrate SB includes, for example, single crystal silicon. Low-concentration p type impurities (for example, B (boron)) are introduced into the semiconductor substrate SB, for example.

Next, as shown in FIGS. 2 and 3, using photolithography and dry etching techniques, a plurality of trenches (concave portions) D1 are formed in a row in a main surface of the semiconductor substrate SB. Each trench D1 reaches halfway of the depth of the semiconductor substrate SB. As shown in FIG. 2, each trench D1 is formed, for example, in the shape of an island. In a direction of X along the main surface of the semiconductor substrate SB, the trenches D1 are arranged at regular intervals in a row. Further, with respect to predetermined trenches D1 of a first row, other trenches D1 of a second row next to each other in a direction along the main surface of the semiconductor substrate SB and, at the same time, in a direction of Y which intersects perpendicularly to the direction of X are arranged at positions shifted half cycle term to the trenches D1 of the first row. Also, unlike arrangement shown in FIG. 2, the trenches D1 may be arranged in the shape of a matrix.

Figure 4:
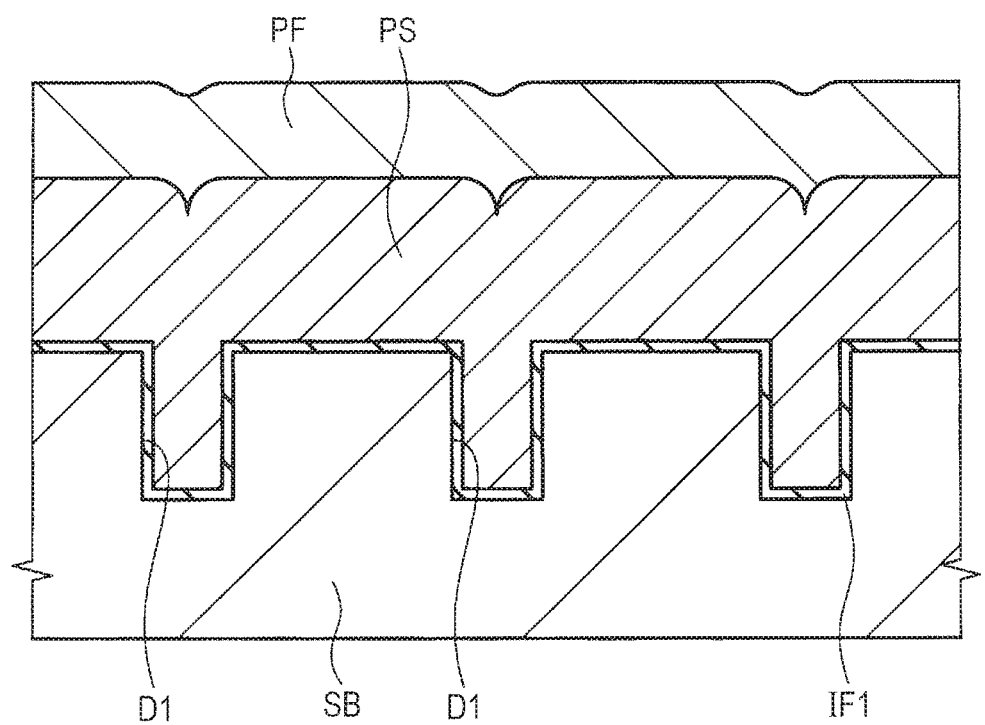
FIG. 4 is a cross-sectional view showing a manufacturing process of the semiconductor device subsequent to the manufacturing process shown in FIG. 3.

Next, as shown in FIG. 4, using a thermal oxidation method, an insulating film IF1 which covers the main surface of the semiconductor substrate is formed. The insulating film IF1 is a thin film which does not fill the trench D1 completely and, for example, it includes a silicon oxide film. The insulating film IF1 covers the main surface of the semiconductor substrate SB, a bottom face of the trench D1 at a position lower than the main surface of the semiconductor substrate SB, and a sidewall of the trench D1.

Next, using a CVD (Chemical Vapor Deposition) method, for example, a poly-silicon film PS and a phosphorous film PF are sequentially formed (deposited) over the insulating film IF1. The poly-silicon film PS is so formed as to fill the trench D1 completely. Further, the phosphorous film PF includes P (phosphorus) and is a film (impurity film, impurity-containing film) provided for diffusing P (phosphorus) being impurities into the poly-silicon film PS. In this regard, an upper surface of the poly-silicon film PS is directly in contact with the phosphorous film PF. In the direction along the main surface of the semiconductor substrate SB, namely, over the upper surface of the poly-silicon film PS immediately above a central portion of the trench D1 in a horizontal direction, a concave portion is formed.

Figure 5:
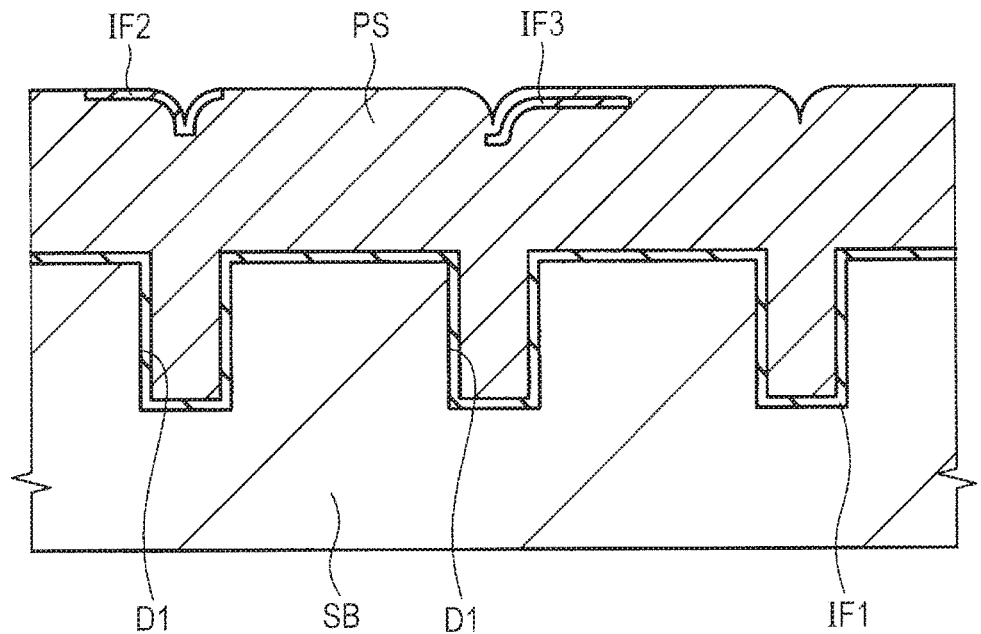
FIG. 5 is a cross-sectional view showing a manufacturing process of the semiconductor device subsequent to the manufacturing process shown in FIG. 4.

Subsequently, as shown in FIG. 5, by applying heat treatment to the semiconductor substrate SB at about 1000° C., P (phosphorus) in the phosphorous film PF is diffused into the poly-silicon film PS. In this regard, the P (phosphorus) being diffusing n type impurities diffuse up to a bottom face and a sidewall of the poly-silicon film PS in the trench D1. Then, the phosphorous film PF is removed by etching.

The poly-silicon film PS in the trench D1 is a conductive type film to be a trench gate electrode of a MOSFET later. As a method for introducing impurities into the poly-silicon film PS to improve conductivity of the trench gate electrode, an ion implantation method can be used. With the ion implantation method, however, it is difficult to introduce high-concentration impurities into the poly-silicon film PS. Therefore, in this process, as a method for diffusing high-concentration impurities, a thermal diffusion method which is more advantageous than the ion implantation method is used.

At this time, by applying heat treatment in a state where the phosphorous film PF (see FIG. 4) is deposited over the poly-silicon film PS, silicon oxide films IF2 and IF3 are formed in part of a surface layer of the poly-silicon film PS. The surface layer referred to here is a region including not only over a surface of the poly-silicon film PS but also inside the poly-silicon film PS near the surface of the poly-silicon film PS.

The silicon oxide film IF2 is formed over an interface between the poly-silicon film PS and the phosphorous film PF, i.e., over the upper surface of the poly-silicon film PS. Further, the silicon oxide film IF2 is formed, for example, in a concave portion of the upper surface of the poly-silicon film PS immediately above the trench D1. Moreover, the silicon oxide film IF3 is formed inside the poly-silicon film PS near the upper surface of the poly-silicon film PS. That is, the silicon oxide film IF3 is covered with the poly-silicon film PS and is not exposed over the surface of the poly-silicon film PS.

The silicon oxide film IF3 tends to be formed among a plurality of crystals (grains) forming the poly-silicon film PS. Here, for example, the silicon oxide film IF3 is formed straddling immediately over the trench D1 and the main surface of the semiconductor substrate SB adjacent to the trench D1.

Figure 6:
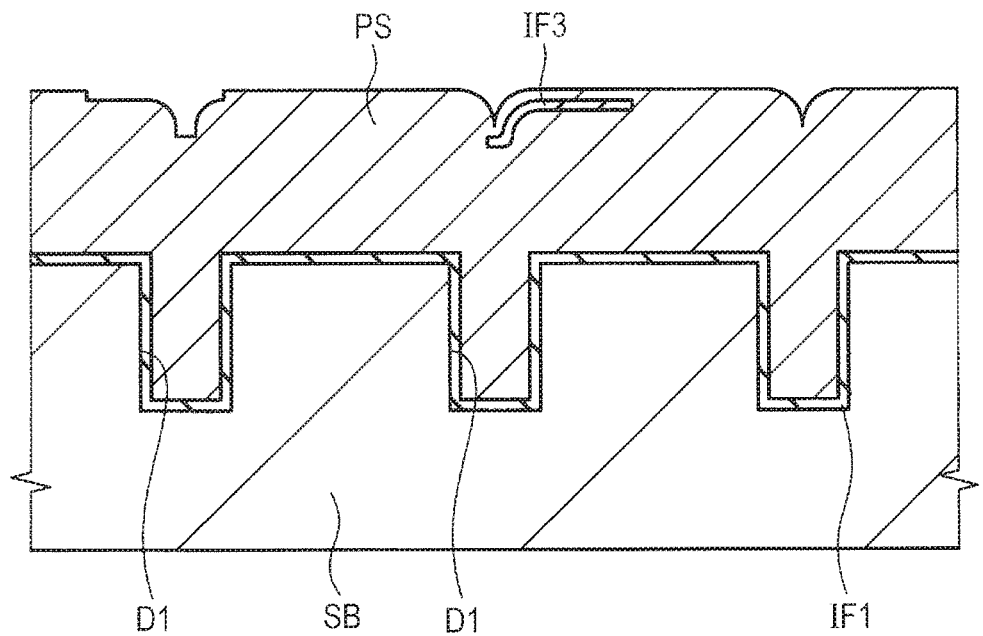
FIG. 6 is a cross-sectional view showing a manufacturing process of the semiconductor device subsequent to the manufacturing process shown in FIG. 5.

Next, as shown in FIG. 6, by applying wet etching, the silicon oxide film IF2 covering the surface of the poly-silicon film PS is removed. The wet etching has a selection ratio to silicon and is applied mainly for removing the silicon oxide film alone. The silicon oxide film IF3, however, is covered with the poly-silicon film PS and even when the wet etching is applied, the silicon oxide film IF3 remains without being removed.

Figure 7:
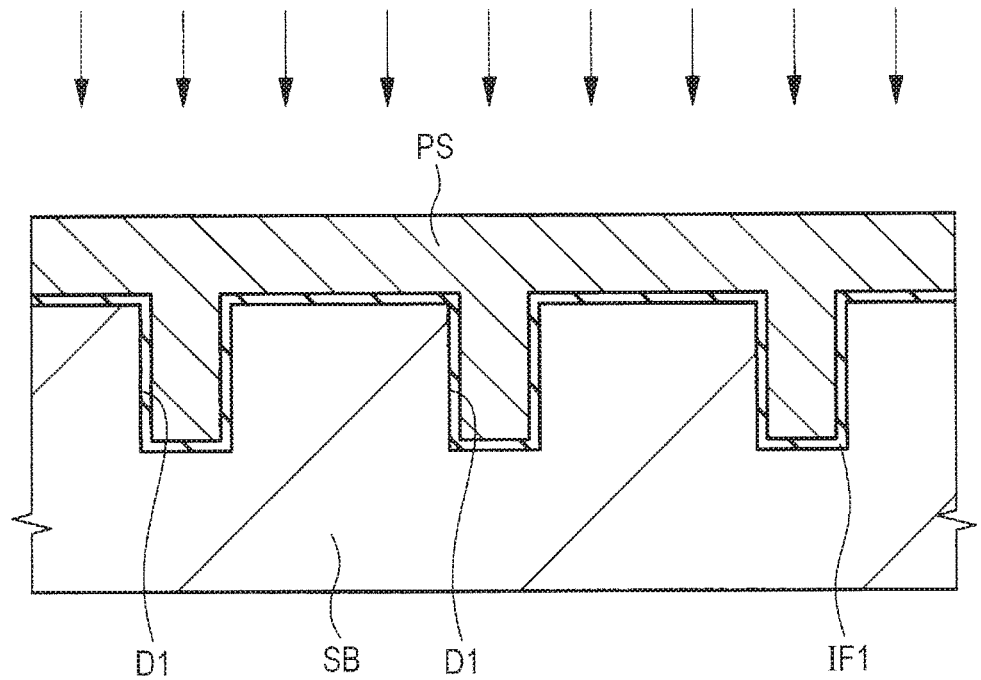
FIG. 7 is a cross-sectional view showing a manufacturing process of the semiconductor device subsequent to the manufacturing process shown in FIG. 6.

Next, as shown in FIG. 7, etch-back is performed by applying dry etching using a fluorocarbon gas or a hydroxyfluorocarbon gas as an etching gas. In this regard, the semiconductor substrate SB and the insulating film IF1 are not exposed, and part of the upper surface of the poly-silicon film PS is retreated to a predetermined position over a main surface of the semiconductor substrate SB. In other words, the upper surface of the poly-silicon film PS is retreated and all of the silicon oxide films IF3 is removed.

That is, part of the upper portion of the poly-silicon film PS and the silicon oxide film IF3 covered with the part of the poly-silicon film PS are removed here. In this regard, the poly-silicon film PS and the silicon oxide film IF3 are etched at equivalent speeds. Therefore, it is desirable that the selection ratio of the dry etching to the silicon oxide is about 0.8 to 1.0.

The reason why the same etching speed is used for the poly-silicon film PS and the silicon oxide film IF3 is to prevent the etch-back process from causing irregularities over the upper surface of the poly-silicon film PS. That is, when irregularities actually occur over the upper surface of the poly-silicon film PS, as will be described later with reference to FIGS. 15 and 16, part of the poly-silicon film PS remains over the main surface of the semiconductor substrate SB and may cause a short circuit etc., which must be avoided.

If the selection ratio of the dry etching to the silicon oxide is greater than 1.0, it may be such that, when the dry etching is performed, the poly-silicon film PS is excessively removed as compared to the silicon oxide film IF3 and a convex portion including the poly-silicon film PS may remain immediately under the silicon oxide film IF3. Therefore, here, the selection ratio of the etching is adjusted to about 0.8 to 1.0 so that etching speeds for the poly-silicon film PS and the silicon oxide film IF3 may be equivalent. As a consequence, the upper surface of the poly-silicon film PS after the dry etching becomes substantially flat. Hereinafter, the dry etching process explained using FIG. 7 may be referred to as a "first dry etching process."

For the fluorocarbon gas described above, a $C_xF_y$ gas such as, for example, a $CF_4$ gas, a $C_4F_8$ gas, or a $C_5F_8$ gas can be used. Also, for the hydroxy-fluorocarbon gas described above, a $C_xH_yF_z$ gas, such as, for example, a $CHF_3$ gas can be used.

Here, the upper surface of the poly-silicon film PS is so retreated as not to reach a height of the upper surface of the insulating film IF1. The amount of etching in the first dry etching process, i.e., a thickness of the poly-silicon film PS to be removed by etching is smaller than a thickness from the upper surface of the poly-silicon film PS immediately before the dry etching to the uppermost surface of the insulating film IF1. Therefore, immediately after the dry etching process, the entire upper surface of the insulating film IF1 over the semiconductor substrate SB located between the adjacent trenches D1 is covered with the poly-silicon film PS. In other words, even if the first dry etching process is performed, the insulating film IF1 is not exposed.

Thus, in the first dry etching process, the insulating film IF1 is not exposed. The reason is that since the first dry etching process is performed on the condition that the silicon and the silicon oxide are removed at substantially the same speed, the insulating film IF1 cannot be used as an etching stopper film. That is, when the insulating film IF1 cannot be used as the etching stopper film, in a dry etching process to be described later using FIG. 8, it becomes difficult to form a trench gate electrode with a desired thickness in the trench D1.

Further, when the insulating film IF1 is exposed by performing the first dry etching process whose selection ratio to silicon oxide is about 1, the insulating film IF1 is removed by over etching and the main surface of the semiconductor substrate SB between the adjacent trenches D1 is exposed to the dry etching, causing a damage to the main surface of the semiconductor substrate SB. Therefore, here, in the first dry etching process, of the entire poly-silicon film PS, an upper layer alone is removed so that the insulating film IF1 may not be exposed.

Figure 8:
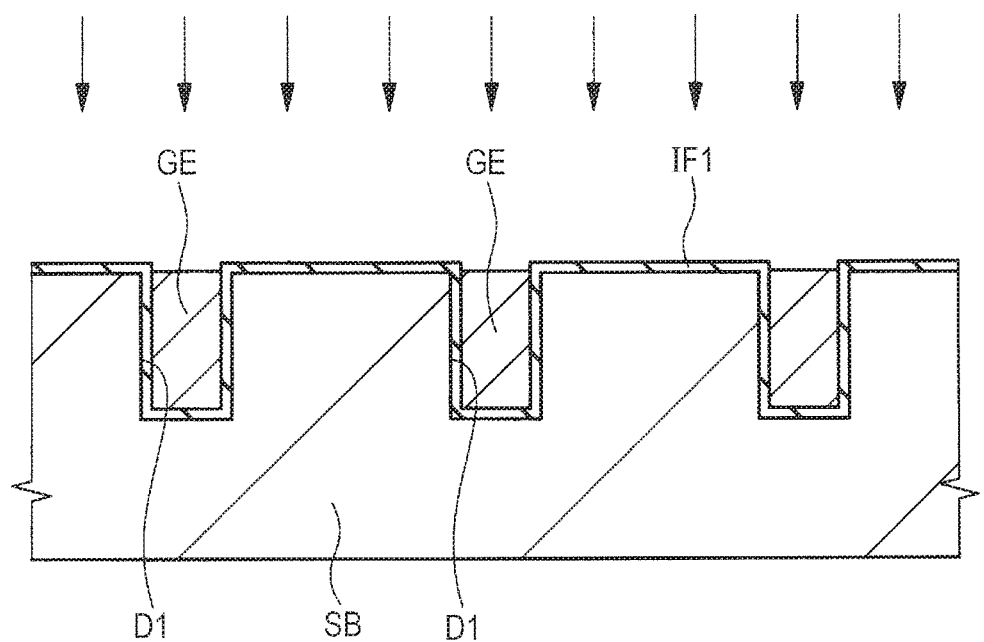
FIG. 8 is a cross-sectional view showing a manufacturing process of the semiconductor device subsequent to the manufacturing process shown in FIG. 7.

Next, as shown in FIG. 8, by performing dry etching using, for example, a $Cl_2$ gas as an etching gas, etch-back is applied to the upper surface of the poly-silicon film PS. Accordingly, an upper surface of the insulating film IF1 covering the main surface of the semiconductor substrate SB between the adjacent trenches D1 is exposed. In this regard, by leaving a poly-silicon film PS inside each of the trenches D1 without applying etching, a trench gate electrode GE including the poly-silicon film PS in each of the trenches D1 is formed. That is, in the trench D1 of the main surface of the semiconductor substrate SB, the trench gate electrode GE is embedded through the insulating film IF1 being a gate insulating film. In this regard, the poly-silicon film PS is not left immediately above the main surface of the semiconductor substrate SB adjacent to the trench D1. Hereinafter, the dry etching process explained using FIG. 8 may be referred to as a "second dry etching process."

Incidentally, in the dry etching using, for example, the $Cl_2$ gas, its selection ratio to silicon oxide is about 2.5. That is, in the second dry etching process, the etching speed of the poly-silicon film is 2.5 times as fast as that of the silicon oxide film. Thus, since the dry etching has the selection ratio to the silicon oxide film, even if the dry etching is continued until the insulating film IF1 is exposed, it becomes possible to prevent the main surface of the semiconductor substrate SB from being exposed by removing the insulating film IF1. That is, immediately after the second dry etching process, the main surface of the semiconductor substrate SB between the adjacent trenches D1 is covered with the insulating film IF1.

Further, for example, an HBr gas or an $SF_6$ gas other than the $Cl_2$ gas can also be used for the dry etching. Moreover, an $O_2$ gas may be added to one of those gases for performing the dry etching.

Also, in this process, the etch-back explained using FIG. 7 and the etch-back explained using FIG. 8 are continuously performed in the same etching unit (chamber). That is, when the etch-back explained using FIG. 7 has been performed, the etching gas supplied into the chamber of the etching unit is changed, for example, from the $CF_4$ gas to the $Cl_2$ gas. After that, the etch-back explained using FIG. 8 is performed. Alternatively, the etch-back explained using FIG. 7 and the-etch back explained using of FIG. 8 may be performed in separate etching units (chambers).

Still further, in the process explained using FIG. 5, when the silicon oxide film IF2 is so formed as to cover the concave portion of the upper surface of the poly-silicon film PS immediately above the trench D1, in the wet etching explained using FIG. 6, it is possible that the silicon oxide film IF2 in the concave portion cannot be removed. Even in such a case, since the above first dry etching process has been performed in the present embodiment, the silicon oxide film IF2 of the concave portion can be removed. As a result, it becomes possible to prevent the silicon oxide film IF2 from becoming an obstacle to etching in the dry etching process explained using FIG. 8.

Figure 9:
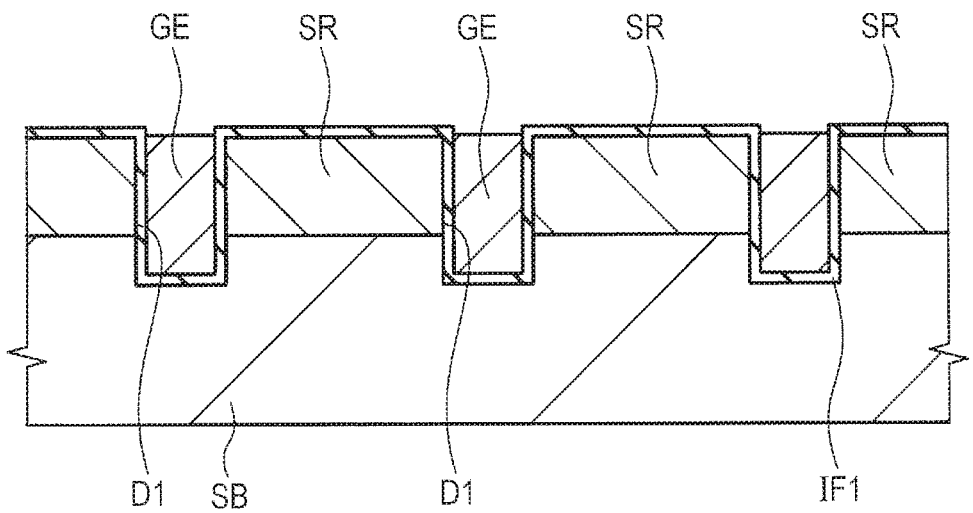
FIG. 9 is a cross-sectional view showing a manufacturing process of the semiconductor device subsequent to the manufacturing process shown in FIG. 8.

Next, as shown in FIG. 9, in a state where the upper surface of the trench gate electrode GE is covered with a resist pattern (not shown) including a photo-resist film, n type impurities (for example, P (phosphorus) or As (arsenic)) are implanted into the main surface of the semiconductor substrate SB by the ion implantation method through the insulating film IF1. Thus, the source region SR being an n type semiconductor region is formed over the main surface of the semiconductor substrate SB between the trenches D1 adjacent to each other. The source region SR has a formation depth shallower than the trench D1. Then, the above resist pattern is removed.

Figure 10:
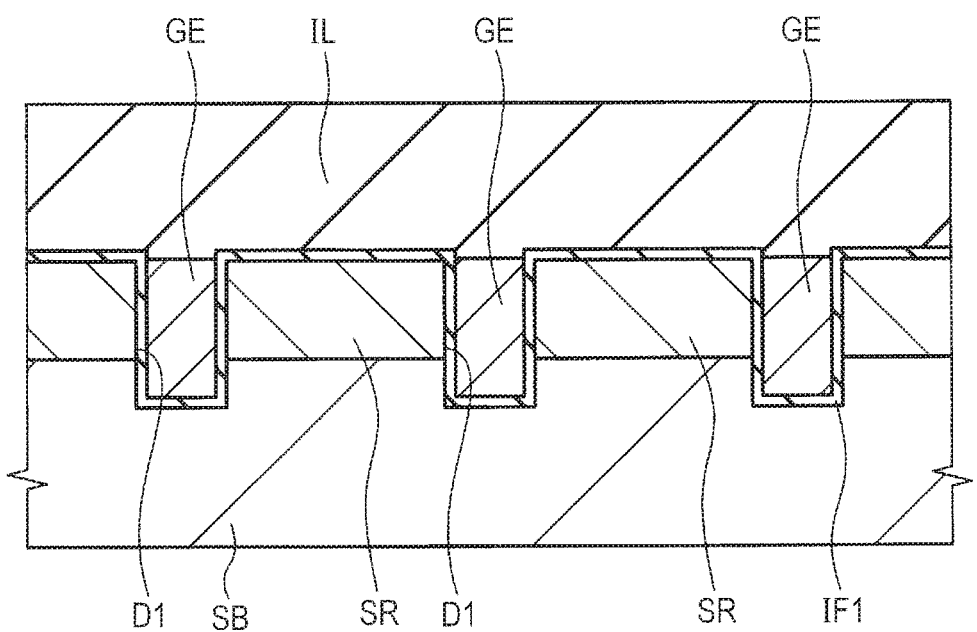
FIG. 10 is a cross-sectional view showing a manufacturing process of the semiconductor device subsequent to the manufacturing process shown in FIG. 9.

Next, as shown in FIG. 10, using a CVD method, for example, an interlayer insulating layer IL is formed over the main surface of the semiconductor substrate SB, i.e., over the insulating film IF1 and over the upper surface of the trench gate electrode GE. The interlayer insulating film IL includes, for example, a silicon oxide film. Then, an upper surface of the interlayer insulating film IL is polished and flattened using, for example, a CMP (Chemical Mechanical Polishing) method.

Figure 11:
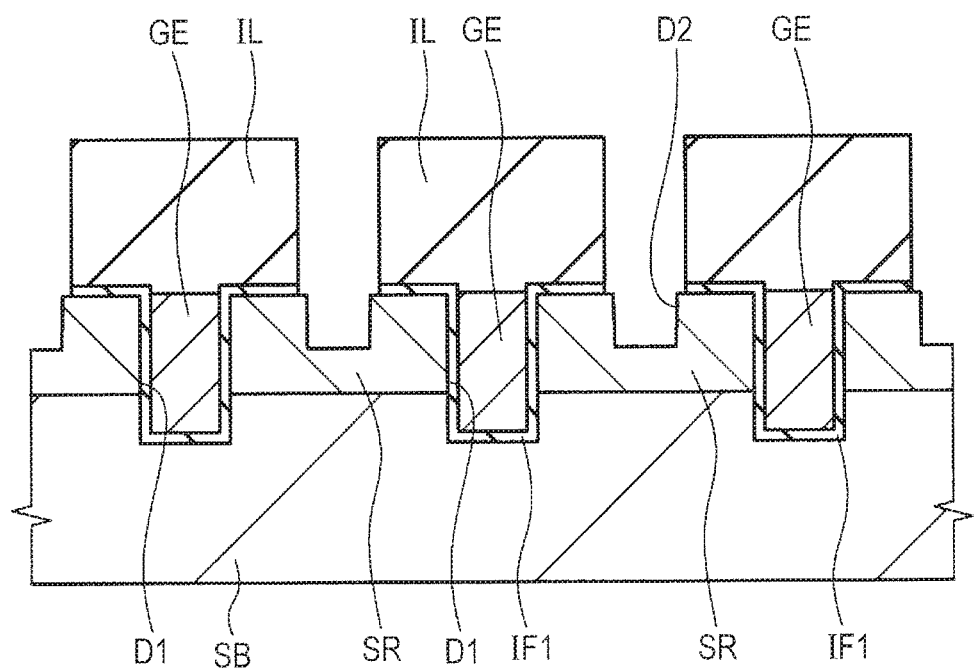
FIG. 11 is a cross-sectional view showing a manufacturing process of the semiconductor device subsequent to the manufacturing process shown in FIG. 10.

Next, as shown in FIG. 11, a plurality of contact holes which penetrate the interlayer insulating layer IL and the insulating film IF1 is formed using photolithography and dry etching techniques. Then, a trench D2 is formed in the main surface of the semiconductor substrate SB by removing the insulating film IF1 immediately under each contact hole and part of the main surface of the semiconductor substrate SB through dry etching. A formation depth of the trench D2 is shallower than a formation depth of each of the trench D1 and the source region SR. The trench D2 is formed so that part of the contact plug (joint part) to be coupled to the source region SR is embedded in the main surface of the semiconductor substrate SB.

The contact hole is formed immediately above each source region SR and is not formed immediately above the trench gate electrode GE. However, in a region which is not shown, a contact hole which exposes the upper surface of the trench gate electrode GE is also formed.

Next, as shown in FIGS. 12 and 13, a plurality of contact plugs CP which fill the contact holes and the trench D2 are formed. That is, first, the inside of the contact hole and the trench D2 are filled by using a sputtering method, for example, and depositing a metal film (for example, W (tungsten) film), over the main surface of the semiconductor substrate SB including over the interlayer insulating layer IL. Then, for example, using the CMP method, the excessive metal film over the interlayer insulating layer IL is removed and the upper surface of the interlayer insulating layer IL is exposed. In this way, the contact plug CP embedded in the inside of each of the contact holes is formed. The upper surface of the contact plug CP and the upper surface of the interlayer insulating layer IL are made flat in a substantially same plane. In addition, in FIG. 12, the insulating film IF1 which is a gate insulating film is not shown.

The contact plug CP is electrically coupled with the source region SR over a sidewall and a bottom face of the trench D2. That is, the contact plug CP is coupled to the upper surface of the source region SR beside the trench D1. Moreover, in a region which is not shown, a contact plug CP coupled to the upper surface of the trench gate electrode GE is also formed.

As shown in FIG. 12, the source region SR is formed over each of the upper surfaces of the semiconductor substrates SB arranged in the shape of an island, and the contact plug CP is coupled to the central part of the source region SR in a plan view. The trench gate electrodes GE are formed around each of the source regions SR arranged in the shape of the island in the shape of meshes of a net. Moreover, the contact plug CP coupled to the source region SR is not in contact with the trench gate electrode GE. That is, the contact plug CP and the trench gate electrode GE are spaced from each other, and are separated electrically.

Figure 14:
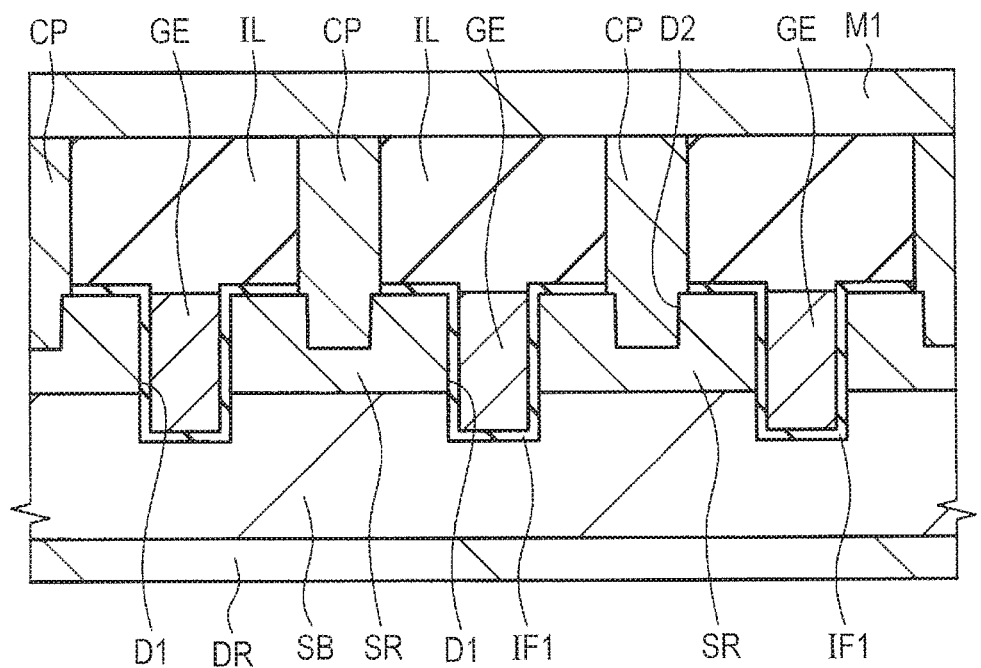
FIG. 14 is a cross-sectional view showing a manufacturing process of the semiconductor device subsequent to the manufacturing process shown in FIG. 13.

Next, as shown in FIG. 14, over the upper surface of the interlayer insulating layer IL and over the upper surface of the contact plug CP, using the sputtering method, for example, a metal film is deposited. Then, a wiring M1 which includes the metal film is formed by processing the metal film using the photolithography and etching techniques. The wiring M1 mainly includes, for example, an Al (aluminum) film. The wiring M1 is coupled to the upper surface of the contact plug CP and is electrically coupled to the source region SR through the contact plug CP. That is, at the time of an operation of the MOSFET to be described later, a voltage is applied to the source region SR through the wiring M1 and the contact plug CP.

Next, into a back surface opposite to the main surface of the semiconductor substrate SB, n type impurities (for example, P (phosphorus) or As (arsenic)) are introduced by the ion implantation etc. Thus, over the back surface of the semiconductor substrate SB, a drain region DR being an n type semiconductor region is formed. The drain region DR is a region formed from the back surface of the semiconductor substrate SB toward the main surface side of the semiconductor substrate SB with a predetermined depth and does not reach a bottom portion of the trench D1.

As above, a trench type MOSFET (MOS type field-effect transistor) including the trench gate electrode GE, the source region SR, and the drain region DR is formed, and the semiconductor device according to the present embodiment is substantially completed. The MOSFET having a source/drain region being an n type semiconductor region is an n type MOSFET. Since the trench type MOSFET includes the trench gate electrode GE, it can be used as a high withstand-voltage element.

Effects of the Present Embodiment

Figure 15:
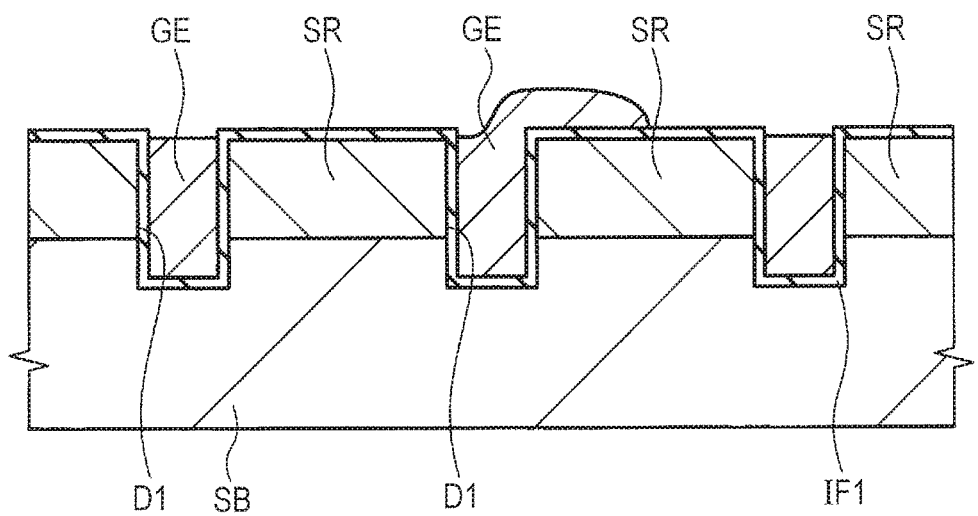
FIG. 15 is a cross-sectional view showing a manufacturing process of a semiconductor device being a comparative example.
Figure 16:
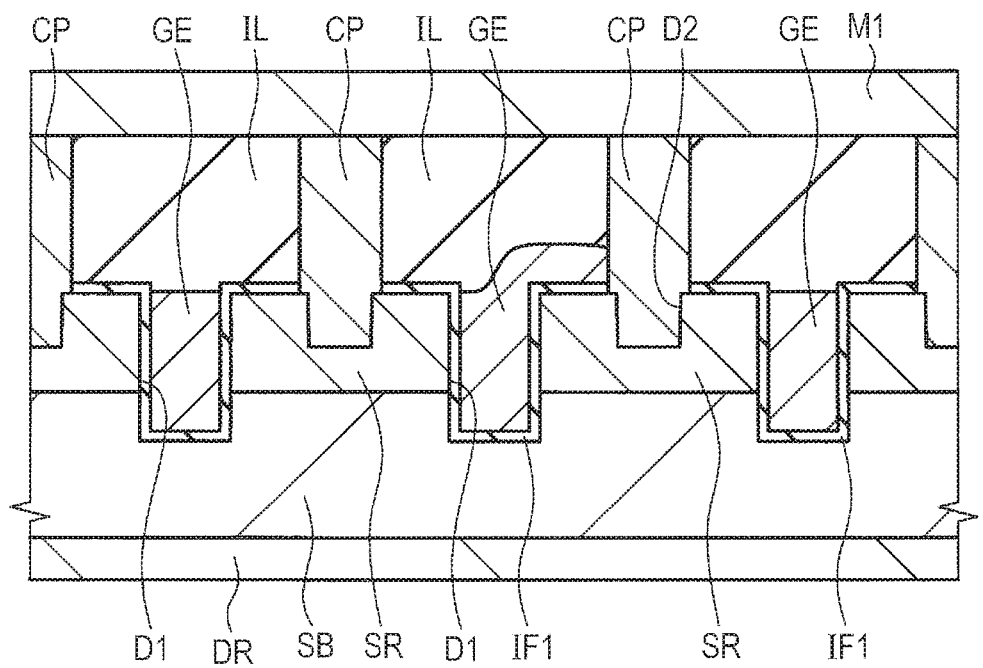
FIG. 16 is a cross-sectional view showing a manufacturing process of the semiconductor device subsequent to the manufacturing process shown in FIG. 15.

Hereafter, there will be explained the effects of the manufacturing method of the semiconductor device of the present embodiment using FIGS. 15 and 16 which is a comparative example. FIGS. 15 and 16 are cross-sectional views showing the manufacturing process of the semiconductor device being the comparative example. There is a difference, between the present embodiment and the comparative example, in the method of etch-back with respect to the poly-silicon film for forming the trench gate electrode.

According to the manufacturing method of the semiconductor device of the comparative example which is a manufacturing method of the trench type MOSFET, first, the process similar to what has been explained using FIGS. 1 to 6 is performed. That is, using a thermal diffusion method, P (phosphorus) is diffused into a poly-silicon film PS to be a trench gate electrode GE later from a phosphorous film over the poly-silicon film PS. Then, by wet etching, a silicon oxide film IF2 formed over the upper surface of the poly-silicon film PS is removed.

Next, as shown in FIG. 15, by applying etch-back to the upper surface of the poly-silicon film PS according to the dry etching method, the upper surface of the insulating film IF1 is exposed and, thereby, the trench gate electrode GE which includes the poly-silicon film PS in the trench D1 is formed. In this regard, the $Cl_2$ gas, the HBr gas, or the $SF_6$ gas is used for the dry etching applied to the upper surface of the poly-silicon film PS. Moreover, the etching may be performed by adding the $O_2$ gas to one of those gases.

The above dry etching are performed using the $Cl_2$ gas, the HBr gas, or the $SF_6$ gas because the etching speed with respect to silicon is fast, and it is possible to secure the selection ratio to silicon oxide which forms the insulating film IF1 which is a base of the poly-silicon film PS. The selection ratio of the etching to the silicon oxide is about 2.5.

Incidentally, in the wet etching process explained using FIG. 6, the silicon oxide film IF2 over the upper surface of the poly-silicon film PS can be removed. However, the silicon oxide film IF3 which is not exposed from the poly-silicon film PS cannot be removed. As a consequence, according to the comparative example, the etch-back explained using FIG. 15 is applied with the silicon oxide film IF3 being left. In this case, the dry etching is performed under the condition of having a selection ratio to the silicon oxide. Therefore, the silicon oxide film IF3 becomes an obstacle to the etching.

Accordingly, when the etching is stopped while part of the upper surface of the insulating film IF1 is exposed by the etch back, under the area where the silicon oxide film IF3 has been formed, it is conceivable that part of the poly-silicon films PS remains over the main surface of the semiconductor substrate SB as part of the trench gate electrode GE without being removed. That is, there occur irregularities over the upper surface of the poly-silicon film PS and part of the trench gate electrode GE may be formed outside the trench D1. The comparative example shows a configuration in which part of the trench gate electrode so remains as to straddle the main surface of the semiconductor substrate SB between the adjacent trenches D1.

Next, as shown in FIG. 16, by performing processes similar to those explained with reference to FIGS. 9 to 14, the semiconductor device of the comparative example including a trench type MOSFET is substantially completed. That is, the source region SR, the trench D2, the contact plug CP, the drain region DR, etc. are formed. In this regard, when part of the trench gate electrode GE is formed outside the trench D1 as described above, the trench gate electrode GE is formed immediately above the source region SR. Therefore, the contact plug CP coupled to the source region SR comes in contact with the trench gate electrode GE over the source region SR, thereby, causing a short circuit between the gate and the sources. That is, in the etch-back process explained using FIG. 15, the silicon oxide film IF3 (see FIG. 6) becomes an obstacle to etching, causing an etching failure. Consequently, a short circuit occurs and the MOSFET becomes unable to operate normally. In other words, reliability of the semiconductor device is degraded.

Also, even if part of the trench gate electrode GE and the contact plug CP are not in contact, when the part of the trench gate electrode GE is formed immediately above the source region SR, namely, formed close to the contact plug CP, withstand voltage between the gate and the source is lowered, which degrades the reliability of the semiconductor device.

In view of the above, according to the manufacturing method of the semiconductor device of the present embodiment, as explained using FIG. 7, in order to remove the silicon and silicon oxide at equivalent etching speeds, dry etching is applied using a fluorocarbon gas or a hydroxy-fluorocarbon gas as an etching gas and, thereby, an upper layer (surface layer) of the poly-silicon film PS and the silicon oxide film IF3 are removed. That is, in the etch-back process where the trench gate electrode GE (see FIG. 8) is formed leaving the poly-silicon film PS in the trench D1 alone, an etching failure is prevented in a following manner. That is, there is performed in advance an etching process (see FIG. 7) being different from an etching process (see FIG. 8) which is performed when exposing the insulating film IF1 with respect to the oxide silicon film IF3 being an obstacle to the etching.

That is, according to the present embodiment, the dry etching process for applying etch-back to the poly-silicon film PS and forming the trench gate electrode GE includes the first dry etching process (see FIG. 7) and the second dry etching process (see FIG. 8). In this regard, by performing the first dry etching process at an early stage of the dry etching process, the silicon oxide film IF3 in the surface layer of the poly-silicon film PS is removed.

Also, in the first dry etching process, in order to adjust the etching speeds for the poly-silicon film PS and the silicon oxide film IF3 to be equivalent, the selection ratio to the silicon oxide in the first dry etching process is set to 0.8 to 1.0. Accordingly, it becomes possible to prevent irregularities from occurring over the upper surface of the poly-silicon film PS after the first dry etching process. That is, the upper surface of the poly-silicon film PS can be flattened after the etching. Further, in the second dry etching process, in order to secure the selection ratio to the insulating film IF1 including the silicon oxide film, the selection ratio to the silicon oxide is set to 2.5. That is, the selection ratio to the silicon oxide in the first dry etching process explained using FIG. 7 is smaller than the selection ratio to the silicon oxide in the second dry etching process explained using FIG. 8.

According to the present embodiment, all of the silicon oxide film in the surface layer of the poly-silicon film PS can be removed by the first dry etching process. Therefore, in the subsequent second dry etching process, etching can be applied without being disturbed by the oxide silicon film. As a result, it becomes possible to prevent the occurrence of a short circuit between the trench gate electrode GE and the source region SR shown in FIG. 14 and lowering of withstand voltage between the trench gate electrode GE and the source region SR which might be caused when irregularities occur over the upper surface of the poly-silicon film PS (trench gate electrode GE) and part of the trench gate electrode GE remains over the main surface of the semiconductor substrate SB outside the trench D1. Thus, reliability of the semiconductor device can be improved.

The invention achieved by the inventors has been described above in detail on the basis of the embodiment. However, it is obvious that the present invention is not limited to the embodiment, but can be variously changed without departing from the scope of the invention.

For example, in the embodiment described above, the case of forming the n type MOSFET has been explained. However, the present invention can also be applied to a p type MOSFET including a p type source/drain region.

What is claimed is:

1. A method of manufacturing a semiconductor device, the method comprising:
   (a) providing a semiconductor substrate;
   (b) forming a trench in a main surface of the semiconductor substrate;
   (c) by sequentially forming an insulating film, a poly-silicon film, and a first film including first conductivity type impurities over the semiconductor substrate, embedding the poly-silicon film in the trench on the insulating film;
   (d) diffusing the impurities into the poly-silicon film from the first film by applying heat treatment to the semiconductor substrate;
   (e) allowing an upper surface of the poly-silicon film to retreat by a first dry etching process;
   (f) after the (e) allowing the upper surface of the poly-silicon film to retreat by the first dry etching process, allowing the upper surface of the poly-silicon film to further retreat by a second dry etching process, until exposing the insulating film and forming a gate electrode comprising the poly-silicon film as embedded in the trench,
   wherein a selection ratio to silicon oxide in the first dry etching process is smaller than a selection ratio to silicon oxide in the second dry etching process.

2. The method of manufacturing a semiconductor device according to claim 1, wherein a fluorocarbon gas or a hydroxy-fluorocarbon gas is used as an etching gas in the first dry etching process.

3. The method of manufacturing a semiconductor device according to claim 2, wherein there is used a $C_XF_Y$ (X, Y: positive integers) being the fluorocarbon gas or a $C_XH_YF_Z$ (X, Y, Z: positive integers) being the hydroxy-fluorocarbon gas as an etching gas in the first etching process.

4. The method of manufacturing a semiconductor device according to claim 2, wherein there is used a $CF_4$ gas being the fluorocarbon gas, a $C_4F_8$ gas, a $C_5F_8$ gas, or a $CHF_3$ gas being the hydroxy-fluorocarbon gas as an etching gas in the first dry etching process.

5. The method of manufacturing a semiconductor device according to claim 3, wherein a $Cl_2$ gas, an HBr gas, or an $SF_6$ gas is used as an etching gas in the second dry etching process.

6. The method of manufacturing a semiconductor device according to claim 1,
wherein, in the (d) diffusing the impurities into the poly-silicon film, a first silicon oxide film is formed in the poly-silicon film by applying heat treatment, and
wherein, in the (e) retreating of the upper surface of the poly-silicon film by the first dry etching process, by performing the first dry etching process, part of the poly-silicon film and the first silicon oxide film covered with the part of the poly-silicon film are removed.

7. The method of manufacturing a semiconductor device according to claim 6, wherein, in the (d) diffusing the impurities into the poly-silicon film, a second silicon oxide film between the upper surface of the poly-silicon film and the first film as well as the first silicon film are formed by applying heat treatment, further comprising:
(d1) before the (e) retreating of the upper surface of the poly-silicon film by the first dry etching process, removing the first silicon oxide film.

8. The method of manufacturing a semiconductor device according to claim 7, wherein, in the (d1) removing of the first silicon oxide film, the first silicon oxide film is removed by wet etching.

9. The method of manufacturing a semiconductor device according to claim 1, wherein a selection ratio of the first dry etching process to silicon oxide is 0.8 to 1.0.

10. The method of manufacturing a semiconductor device according to claim 1, wherein the impurities are phosphorus.

11. The method of manufacturing a semiconductor device according to claim 1, wherein, immediately after the (f) exposing the insulating film and forming the gate electrode including the poly-silicon film in the trench, the main surface of the semiconductor substrate adjacent to the trench is covered with the insulating film.

12. The method of manufacturing a semiconductor device according to claim 1, wherein, after the (e) retreating of the upper surface of the poly-silicon film by the first dry etching process but before the (f) exposing the insulating film and forming the gate electrode including the poly-silicon film in the trench, an upper surface of the insulating film beside the trench is covered with the poly-silicon film.

13. The method of manufacturing a semiconductor device according to claim 1, further comprising:
(g) after the (f) exposing the insulating film and forming the gate electrode including the poly-silicon film in the trench, forming a source region over the main surface of the semiconductor substrate adjacent to the trench;
(h) after the (g) forming of the source region adjacent to the trench, forming an interlayer insulating film over the semiconductor substrate and the gate electrode;
(i) forming a contact plug penetrating the interlayer insulating film and coupled to an upper surface of the source region beside the trench; and
(j) forming a drain region over a back surface on the opposite side of the main surface of the semiconductor substrate,
wherein the gate electrode, the source region, and the drain region form a field-effect transistor.

14. The method of manufacturing a semiconductor device according to claim 13, wherein the source region and the drain region are the first conductivity type semiconductor regions.

15. The method of manufacturing a semiconductor device according to claim 1, wherein the (c) sequentially forming of the insulating film, the poly-silicon film, and the first film including first conductivity type impurities over the semiconductor substrate comprises:
depositing the insulating film on an upper surface of the semiconductor substrate with the trench formed in its main surface, using a thermal oxidation such that the deposited insulating film covers a bottom and sidewalls of the trench but does not completely fill the trench;
depositing the poly-silicon film deposited on the insulating film, using a chemical vapor deposition (CVD) method, so as to completely fill the trench; and
depositing the first film including first conductivity type impurities on top of the poly-silicon film.

16. A semiconductor device manufactured by the method of claim 1.

17. A method of fabricating a semiconductor device, the method comprising:
providing a semiconductor substrate;
forming a trench in a main surface of the semiconductor substrate;
depositing a layer of insulating film on an upper surface of the semiconductor substrate with the trench formed in its main surface, using a thermal oxidation such that the deposited insulating film covers a bottom and sidewalls of the trench but does not completely fill the trench;
depositing a poly-silicon film on the insulating film, using a chemical vapor deposition (CVD) method, so as to completely fill the trench; and
depositing a first film including first conductivity type impurities on top of the poly-silicon film;
diffusing the impurities into the poly-silicon film from the first film by applying heat treatment to the semiconductor substrate;
forming a gate electrode as embedded in the trench by first allowing an upper surface of the poly-silicon film to retreat by a first dry etching process followed by a second dry etching process that exposes a top surface of the insulating film, thereby forming a gate electrode comprising the poly-silicon film as embedded in the trench,
wherein a selection ratio to silicon oxide in the first dry etching process is smaller than a selection ratio to silicon oxide in the second dry etching process.

18. The method of fabricating the semiconductor device according to claim 17, wherein a fluorocarbon gas or a hydroxy-fluorocarbon gas is used as an etching gas in the first dry etching process and a $Cl_2$ gas, an HBr gas, or an $SF_6$ gas is used as an etching gas in the second dry etching process.

19. A method of fabricating a semiconductor device, the method comprising:
provided a semiconductor substrate;
forming a trench in a main surface of the semiconductor substrate; and
forming a gate electrode as embedded in the trench by:
   depositing a layer of insulating film on an upper surface of the semiconductor substrate with the trench formed in its main surface, using a thermal oxidation such that the deposited insulating film covers a bottom and sidewalls of the trench but does not completely fill the trench;
   depositing a poly-silicon film on the insulating film, using a chemical vapor deposition (CVD) method, so as to completely fill the trench; and
   depositing a first film including first conductivity type impurities on top of the poly-silicon film;
   diffusing the impurities into the poly-silicon film from the first film by applying heat treatment to the semiconductor substrate;
   forming the gate electrode as embedded in the trench by first allowing an upper surface of the poly-silicon film to retreat by a first dry etching process followed by a second dry etching process that exposes a top surface of the insulating film, thereby forming a gate electrode comprising the poly-silicon film as embedded in the trench,
wherein a selection ratio to silicon oxide in the first dry etching process is smaller than a selection ratio to silicon oxide in the second dry etching process.

20. The method of fabricating the semiconductor device according to claim 19, wherein a fluorocarbon gas or a hydroxy-fluorocarbon gas is used as an etching gas in the first dry etching process and a $Cl_2$ gas, an HBr gas, or an $SF_6$ gas is used as an etching gas in the second dry etching process.

* * * * *